United States Patent
Budd et al.

(10) Patent No.: US 9,935,089 B2
(45) Date of Patent: Apr. 3, 2018

(54) PACKAGING OPTOELECTRONIC COMPONENTS AND CMOS CIRCUITRY USING SILICON-ON-INSULATOR SUBSTRATES FOR PHOTONICS APPLICATIONS

(71) Applicant: International Business Machines Corporation, Armonk, NY (US)

(72) Inventors: Russell A. Budd, North Salem, NY (US); Mounir Meghelli, Tarrytown, NY (US); Jason Scott Orcutt, Katonah, NY (US); Jean-Olivier Plouchart, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/456,769

(22) Filed: Mar. 13, 2017

(65) Prior Publication Data
US 2017/0186739 A1    Jun. 29, 2017

Related U.S. Application Data

(62) Division of application No. 14/825,393, filed on Aug. 13, 2015, now Pat. No. 9,786,641.

(51) Int. Cl.
*G02B 6/42* (2006.01)
*H01L 25/16* (2006.01)
(Continued)

(52) U.S. Cl.
CPC ............ *H01L 25/167* (2013.01); *G02B 6/122* (2013.01); *G02B 6/124* (2013.01); *G02B 6/1221* (2013.01);
(Continued)

(58) Field of Classification Search
CPC .................................................. G02B 6/4214
See application file for complete search history.

(56) References Cited

U.S. PATENT DOCUMENTS

| 4,851,695 A | 7/1989 | Stein |
| 5,534,094 A | 7/1996 | Arjavalingam et al. |

(Continued)

FOREIGN PATENT DOCUMENTS

| EP | 2637051 A2 | 9/2013 |
| EP | 2650710 A2 | 10/2013 |
| EP | 2703856 A2 | 3/2014 |

OTHER PUBLICATIONS

H.D. Thacker et al., "Hybrid Integration of Silicon Nanophotonics with 40nm-CMOS VLS Drivers and Receivers," IEEE 61st Electronic Components and Technology Conference (ECTC), May-Jun. 2011, pp. 829-835.

(Continued)

*Primary Examiner* — Michelle R Connelly
(74) *Attorney, Agent, or Firm* — Vazken Alexanian; Ryan, Mason & Lewis, LLP

(57) ABSTRACT

Package structures and methods are provided to integrate optoelectronic and CMOS devices using SOI semiconductor substrates for photonics applications. For example, a package structure includes an integrated circuit (IC) chip, and an optoelectronics device and interposer mounted to the IC chip. The IC chip includes a SOI substrate having a buried oxide layer, an active silicon layer disposed adjacent to the buried oxide layer, and a BEOL structure formed over the active silicon layer. An optical waveguide structure is patterned from the active silicon layer of the IC chip. The optoelectronics device is mounted on the buried oxide layer in alignment with a portion of the optical waveguide structure to enable direct or adiabatic coupling between the optoelectronics device and the optical waveguide structure.

(Continued)

The interposer is bonded to the BEOL structure, and includes at least one substrate having conductive vias and wiring to provide electrical connections to the BEOL structure.

16 Claims, 11 Drawing Sheets

(51) Int. Cl.

| | | |
|---|---|---|
| H01L 23/498 | (2006.01) | |
| H01L 27/12 | (2006.01) | |
| H01S 5/022 | (2006.01) | |
| H01L 23/367 | (2006.01) | |
| H01L 21/48 | (2006.01) | |
| H01L 21/84 | (2006.01) | |
| H01S 5/024 | (2006.01) | |
| G02B 6/122 | (2006.01) | |
| G02B 6/124 | (2006.01) | |
| G02B 6/34 | (2006.01) | |
| H01S 5/02 | (2006.01) | |
| H01L 23/485 | (2006.01) | |
| H01L 23/58 | (2006.01) | |
| H01L 25/11 | (2006.01) | |
| G02B 6/132 | (2006.01) | |
| H01L 25/00 | (2006.01) | |
| G02B 6/12 | (2006.01) | |
| H01S 5/026 | (2006.01) | |
| H01S 5/10 | (2006.01) | |
| H01S 5/183 | (2006.01) | |

(52) U.S. Cl.
CPC .............. *G02B 6/132* (2013.01); *G02B 6/34* (2013.01); *G02B 6/4204* (2013.01); *G02B 6/428* (2013.01); *G02B 6/4214* (2013.01); *G02B 6/4274* (2013.01); *H01L 21/486* (2013.01); *H01L 21/4853* (2013.01); *H01L 21/84* (2013.01); *H01L 23/367* (2013.01); *H01L 23/3675* (2013.01); *H01L 23/485* (2013.01); *H01L 23/49827* (2013.01); *H01L 23/49838* (2013.01); *H01L 23/49894* (2013.01); *H01L 23/585* (2013.01); *H01L 25/117* (2013.01); *H01L 25/50* (2013.01); *H01L 27/1203* (2013.01); *H01S 5/021* (2013.01); *H01S 5/0215* (2013.01); *H01S 5/02248* (2013.01); *H01S 5/02272* (2013.01); *H01S 5/02469* (2013.01); *H01S 5/105* (2013.01); *H01S 5/1838* (2013.01); *H01S 5/18361* (2013.01); *G02B 2006/12061* (2013.01); *G02B 2006/12069* (2013.01); *G02B 2006/12123* (2013.01); *G02B 2006/12147* (2013.01); *H01L 2223/58* (2013.01); *H01L 2224/16225* (2013.01); *H01L 2924/15311* (2013.01); *H01S 5/026* (2013.01); *H01S 5/1032* (2013.01); *H01S 5/18341* (2013.01)

(56) References Cited

U.S. PATENT DOCUMENTS

| | | |
|---|---|---|
| 6,450,699 B1 | 9/2002 | Murali et al. |
| 6,690,845 B1 | 2/2004 | Yoshimura et al. |
| 6,706,546 B2 | 3/2004 | Yoshimura et al. |
| 6,821,802 B2 | 11/2004 | Ahn et al. |
| 7,203,387 B2 | 4/2007 | Doan |
| 7,324,716 B2 | 1/2008 | Epitaux |
| 7,920,770 B2 | 4/2011 | Holzwarth et al. |
| 7,939,352 B2 | 5/2011 | Qin et al. |
| 8,110,823 B2 | 2/2012 | Bowers |
| 8,129,811 B2 | 3/2012 | Assefa et al. |
| 8,222,084 B2 | 7/2012 | Dallesasse et al. |
| 8,380,033 B1 | 2/2013 | Fang et al. |
| 8,426,921 B2 | 4/2013 | Assefa et al. |
| 8,470,621 B2 | 6/2013 | Kuo et al. |
| 8,538,206 B1 | 9/2013 | Fish et al. |
| 9,201,203 B2 | 12/2015 | Yamamoto |
| 2004/0071387 A1 | 4/2004 | Mule et al. |
| 2004/0114869 A1* | 6/2004 | Fike ................. G02B 6/124 385/43 |
| 2006/0177173 A1 | 8/2006 | Shastri et al. |
| 2008/0002929 A1 | 1/2008 | Bowers et al. |
| 2008/0318360 A1* | 12/2008 | Chen ............. H01L 21/76898 438/106 |
| 2009/0078963 A1 | 3/2009 | Khodja |
| 2011/0032685 A1 | 2/2011 | Akiba et al. |
| 2011/0133281 A1 | 6/2011 | Assefa et al. |
| 2011/0206379 A1 | 8/2011 | Budd et al. |
| 2012/0135566 A1 | 5/2012 | Pinguet et al. |
| 2012/0147559 A1 | 6/2012 | Barowski et al. |
| 2012/0149148 A1 | 6/2012 | Dallesasse et al. |
| 2013/0022072 A1 | 1/2013 | Bowers |
| 2013/0195137 A1 | 8/2013 | Bowers et al. |
| 2013/0208752 A1 | 8/2013 | Koch |
| 2013/0230274 A1 | 9/2013 | Fish |
| 2013/0334404 A1 | 12/2013 | Pinguet et al. |
| 2014/0029639 A1 | 1/2014 | Zarbock et al. |
| 2014/0029888 A1 | 1/2014 | La Porta et al. |
| 2014/0064659 A1 | 3/2014 | Doerr et al. |
| 2014/0177999 A1 | 6/2014 | Yanagisawa |
| 2014/0203175 A1 | 7/2014 | Kobinsky et al. |
| 2014/0321804 A1* | 10/2014 | Thacker ............. G02B 6/4274 385/14 |
| 2014/0363121 A1 | 12/2014 | Lai et al. |
| 2014/0376857 A1 | 12/2014 | Chantre et al. |
| 2015/0003841 A1 | 1/2015 | McLaren et al. |
| 2015/0010266 A1* | 1/2015 | Webster .............. G02B 6/122 385/14 |
| 2015/0063745 A1 | 3/2015 | Lin et al. |
| 2015/0097257 A1 | 4/2015 | Gambino et al. |
| 2015/0205062 A1 | 7/2015 | Collins et al. |
| 2015/0285998 A1 | 10/2015 | Babakhani et al. |
| 2015/0331187 A1 | 11/2015 | Lee et al. |
| 2016/0142155 A1 | 5/2016 | Kim |
| 2016/0223749 A1 | 8/2016 | Coolbaugh et al. |
| 2016/0233641 A1 | 8/2016 | Chantre et al. |
| 2016/0294155 A1 | 10/2016 | Zheng et al. |

OTHER PUBLICATIONS

M.T. Wade et al., "Energy-Efficient Active Photonics in a Zero-Change, State-of-the-Art CMOS Process," Optical Fiber Communications Conference and Exhibition (OFC), Mar. 2014, 3 pages.

N. Dupuis et al., "30Gbps Optical Link Utilizing Heterogeneously Integrated III-V/Si Photonics and CMOS Circuits," Optical Fiber Communications Conference and Exhibition (OFC), Mar. 2014, 3 pages.

B.R. Koch et al., "Integrated Silicon Photonic Laser Sources for Telecom and Datacom," Optical Fiber Communication Conference and Exposition and the National Fiber Optic Engineers Conference (OFC/NFOEC), Mar. 2013, 3 pages.

G. Fish et al., "Advances in III-V Heterogeneous Integration on Silicon," IEEE Photonics Conference (IPC), Sep. 2012, pp. 747-748.

A. Beling et al., "InP-Based Waveguide Photodiodes Heterogeneously Integrated on Silicon-on-Insulator for Photonic Microwave Generation," Optics Express, Nov. 2013, pp. 25901-25906, vol. 21, No. 22.

J.S. Orcutt et al., "Open Foundry Platform for High-Performance Electronic-Photonic Integration" Optics Express, May 2012, pp. 12222-12232, vol. 20, No. 11.

J.M. Shainline et al., "Depletion-Mode Carrier-Plasma Optical Modulator in Zero-Change Advanced CMOS," Optics Letters, Aug. 2013, pp. 2657-1659, vol. 38, No. 15.

(56) References Cited

OTHER PUBLICATIONS

M.T. Wade et al., "Unidirectional Chip-to-Fiber Grating Couplers in Unmodified 45nm CMOS Technology," Conference on Lasers and Electro-Optics (CLEO), Jun. 2014, 2 pages.
List of IBM Patents or Patent Applications Treated as Related.

* cited by examiner

100

500

700

PACKAGING OPTOELECTRONIC COMPONENTS AND CMOS CIRCUITRY USING SILICON-ON-INSULATOR SUBSTRATES FOR PHOTONICS APPLICATIONS

TECHNICAL FIELD

This disclosure relates generally to packaging techniques for photonics applications and, in particular, to structures and methods for integrating optoelectronic devices and CMOS (complementary metal oxide semiconductor) devices for photonics applications.

BACKGROUND

In general, photonics applications implement various functions with regard to light including, for example, generating, emitting, transmitting, modulating, signal processing, amplifying, and/or detecting/sensing light within the visible and near-infrared portions of the electromagnetic spectrum. Various techniques have been developed for implementing photonics applications. For example, some conventional techniques involve co-fabricating optoelectronic devices with CMOS integrated circuitry to implement photonics systems. The main challenge with these techniques is that the lithography used for photonics is several generations behind the most advanced CMOS. Typically, the lithography for photonics is in the range of 130 nm to 90 nm, and therefore, CMOS circuitry formed based on these design rules provides limited speed performance, thus limiting the electrical and photonics I/O speed.

Other conventional techniques for implementing photonics applications include fabricating dedicated silicon photonics chips with no integrated CMOS. The main problem with these techniques is the lack of integrated CMOS functions and therefore, the lack of analog and digital on-chip controls. For example, a ring resonator array with a heater control loop would be difficult to implement. Another problem with this approach is that high-speed I/O data communications between silicon photonics chips and other electronics chips mounted on an application board is implemented using wire-bond connections to the application board. The scaling of data communication above 25 Gbit/s with wire bonding is extremely difficult. Moreover, when using wire bonds with optoelectronic chips having optoelectronic components such as laser diodes, there is no room to install a heat sink on the optoelectronic chips, which is critical for reliable operation of laser diodes, for example.

SUMMARY

Embodiments of the invention include package structures and methods to integrate optoelectronic and CMOS devices using SOI (silicon-on-insulator) semiconductor substrates for photonics applications.

In one embodiment of the invention, a package structure includes a photonics package, wherein the photonics package includes an integrated circuit chip, an optoelectronics device mounted to the integrated circuit chip, and an interposer mounted to the integrated circuit chip. The integrated circuit chip includes a SOI substrate, wherein the SOI substrate has a buried oxide layer, an active silicon layer disposed adjacent to the buried oxide layer, and a BEOL (back-end-of-line) structure formed over the active silicon layer. An integrated optical waveguide structure is patterned from the active silicon layer of the integrated circuit chip. The optoelectronics device is mounted on the buried oxide layer of the integrated circuit chip in alignment with at least a portion of the integrated optical waveguide structure. The interposer is bonded to the BEOL structure of the integrated circuit chip. The interposer includes at least one substrate having a plurality of conductive through vias and wiring to provide electrical connections to the BEOL structure.

In another alternate embodiment of the invention, the package structure further includes a second integrated circuit chip, a package interposer, and an application board. The photonics package is mounted to a first side of the package interposer and the second integrated circuit chip is mounted to a second side of the package interposer, opposite the first side of the package interposer. The package interposer includes electrical wiring and conductive through vias to provide electrical connections between the photonics package and the second integrated circuit chip. The application board includes an integrated recess formed in one side of the application board. The package interposer is mounted to the application board with at least a portion of the photonics package disposed within the integrated recess of the application board. The application board also includes a plurality of thermal vias formed therein in alignment with the integrated recess. The photonics package is disposed within the integrated recess of the application board such that a backside of the optoelectronics device of the photonics package is in thermal contact with the plurality of thermal vias.

In yet another alternate embodiment of the invention, the package structure further includes a second integrated circuit chip, a package interposer having a hole formed through the package interposer, and an application board. The second integrated circuit chip is flip-chip mounted to a first side of the package interposer. The photonics package is mounted to a front side of the second integrated circuit chip and disposed within the hole of the package interposer. A second side of the package interposer is mounted to a first side of the application board. The application board includes a heat sink formed on the first side of the application board, and a plurality of thermal vias formed therein in alignment with heat sink. The photonics package is disposed within the hole of the package interposer such that a backside of the optoelectronics device of the photonics package is in thermal contact with the heat sink formed on the first side of the application board.

Another embodiment of the invention includes a method to construct a package structure. The method includes: fabricating an integrated circuit chip comprising a SOI substrate, wherein the SOI substrate comprises a bulk substrate layer, a buried oxide layer disposed on the bulk substrate layer, an active silicon layer disposed on the buried oxide layer, and a BEOL structure formed over the active silicon layer, wherein the active silicon layer comprises an integrated optical waveguide structure; bonding a first surface of an interposer substrate to the BEOL structure of the integrated circuit chip; forming conductive through vias in the interposer substrate in alignment with contact pads of the BEOL structure, and forming contact pads on a second surface of the interposer substrate; removing the bulk substrate layer; forming one or more inverted pad structures through the buried oxide layer to buried pads in the BEOL structure; forming solder bumps on the contact pads of the interposer substrate; and mounting an optoelectronics device to the integrated circuit chip such that the optoelectronics device is electrically connected to one or more of the inverted pad structures and such that the optoelectronics device is in contact with a portion of the buried oxide layer and in alignment with at least a portion of the integrated optical waveguide structure.

These and other embodiments of invention will be described or become apparent from the following detailed description of embodiments, which is to be read in conjunction with the accompanying drawings.

BRIEF DESCRIPTION OF THE DRAWINGS

FIGS. 4A, 4B, 4C, 4D, 4E, 4F, 4G, 4H, 4I, and 4J schematically illustrate a method for fabricating a photonics package structure, according to an embodiment of the invention, wherein:

FIG. 4A is a cross-sectional view of a photonics package structure at an intermediate stage of fabrication wherein a SOI semiconductor chip and interposer are bonded together using an adhesive layer, according to an embodiment of the invention;

FIG. 4B is a cross-sectional schematic view of the package structure of FIG. 4A after filing via holes of the interposer with metallic material to form conductive through vias;

FIG. 4C is a cross-sectional schematic view of the package structure of FIG. 4B after removing a bulk substrate layer of the SOI semiconductor chip;

FIG. 4D is a cross-sectional schematic view of the package structure of FIG. 4C after patterning a layer of metallic material on a surface of the interposer substrate to form contact pads that are electrically connected to the conductive vias of the interposer;

FIG. 4E is a cross-sectional schematic view of the package structure of FIG. 4D after forming a photoresist mask and etching a recess in the SOI semiconductor chip down to a buried pad in a BEOL structure of the SOI semiconductor chip;

FIG. 4F is a cross-sectional schematic view of the package structure of FIG. 4E after removing the photoresist mask and depositing a seed layer which lines exposed surfaces within the recess;

FIG. 4G is a cross-sectional schematic view of the package structure of FIG. 4F after depositing and patterning a layer of photoresist material to form a photoresist mask which is used to cover a portion of the seed layer on the buried oxide layer and to expose the recess;

FIG. 4H is a cross-sectional schematic view of the package structure of FIG. 4G after filling the recess with metallic material;

FIG. 4I is a cross-sectional schematic view of the package structure of FIG. 4H after removing the photoresist mask and etching back the metallic material down to the buried oxide layer; and FIG. 4J is a cross-sectional schematic view of the package structure of FIG. 4I after forming solder balls on the contact pads of the interposer.

DETAILED DESCRIPTION

Embodiments will now be described in further detail with regard to package structures and methods to integrate optoelectronic and CMOS devices using SOI semiconductor substrates for photonics applications. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1:
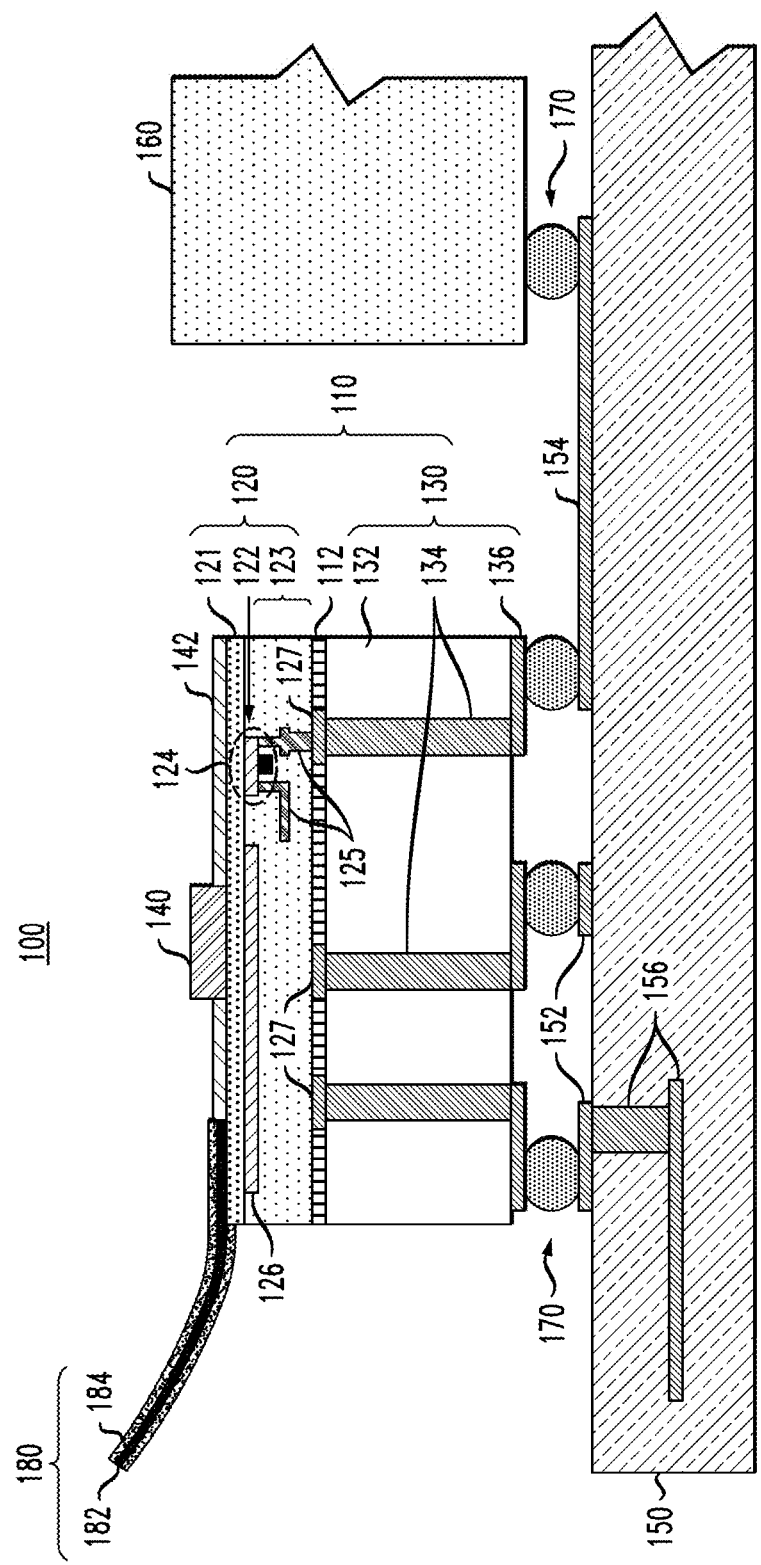
FIG. 1 is schematic cross-sectional side view of a package structure to integrate optoelectronic and CMOS devices using a SOI semiconductor substrate for a photonics application, according to an embodiment of the invention.

FIG. 1 is schematic cross-sectional side view of a package structure to integrate optoelectronic and CMOS devices using a silicon-on-insulator semiconductor substrate, according to an embodiment of the invention. In particular, FIG. 1 is a schematic cross-sectional side view of a package structure 100 comprising a photonics package 110 which includes an assembly of a semiconductor chip 120 with integrated photonics components, an interposer 130, and an optoelectronic device 140. The package structure 100 further comprises an application board 150, and an integrated circuit (IC) chip 160, wherein the photonics package 110 and the IC chip 160 are flip-chip mounted to the application board 150 using an array of solder ball controlled collapse chip connections (C4) 170, for example, or other suitable flip-chip techniques such as micro-C4 or copper pillars, etc.

The semiconductor chip 120 comprises an insulating layer 121, an active silicon layer 122, and a BEOL (back-end-of-line) structure 123. The active silicon layer 122 is patterned and processed to form active devices 124 and one or more of an optical silicon waveguide structure 126 (e.g., single mode silicon-on-insulator waveguides). In one embodiment of the invention, the semiconductor chip 120 is fabricated starting with a SOI (silicon-on-insulator) substrate comprising a bulk substrate (which is removed), a BOX (buried oxide) layer disposed on the bulk substrate, and a thin layer of silicon (SOI layer) disposed on the BOX layer. In one embodiment, the insulating layer 121 in FIG. 1 is a BOX layer, and the active silicon layer is the thin SOI layer formed on the BOX layer.

The active devices 124 and other semiconductor components formed from the active silicon layer 122 comprise active circuity to implement one or more photonic applications. For example, the active circuitry may include optical receivers, optical transmitters or optical transceiver circuits, and other active or passive circuit elements that are commonly used to implement photonic systems. The BEOL structure 123 includes transmission lines and other interconnect structures that are implemented using a series of interconnected metallic traces and conductive vias 125 which are formed within various alternating conductive and insulating/dielectric layers of the BEOL structure 123. The BEOL structure 123 provides a network of interconnects to connect active circuitry and other components formed in the active layer 122. Furthermore, the BEOL structure 123 comprises a plurality of bonding/contact pads 127 such as, for example, ground pads, DC power supply pads, input/output pads, control signal pads, associated wiring, etc., that are formed as part of a final metallization level of the BEOL structure 123.

The interposer 130 comprises a substrate 132, conductive thru vias 134, and a pattern of bonding pads/wiring 136 formed on one surface thereof. In one embodiment of the invention, the interposer substrate 132 is formed of a high-resistivity material such as glass, high-resistivity silicon (HR-Si), or other suitable insulating materials having a resistivity in a range of about 100 Ohm·cm to about 1000 Ohm·cm or greater. Materials such as glass or HR-Si are desirable materials because they have a coefficient of thermal expansion that is the same or similar to the materials of the semiconductor ship 120, which serves to prevent cracking or chip delamination due to thermal expansion and contraction over time. In one embodiment of the invention, the interposer 130 has a thickness of at least 300 um to allow reliable mechanical support.

The conductive through vias 134 (e.g., TGVs (through glass vias) or TSVs (through silicon vias) provide electrical connections between the bonding pads/ wiring 136 of the interposer 130 and the bonding pads/wiring 127 of the BEOL structure 123. The conductive through vias 134 form part of the electrical wiring and interconnects that are utilized for supplying/distributing DC power to the semiconductor chip 120 from power supply lines on the application board 150, and for routing low frequency control signals as well as high-frequency I/O signals, for example, between the application board 150 and the semiconductor chip 120. For high-speed data communication, the use of a low-loss, high-resistivity (>1K Ohm·cm) interposer substrate material is highly desirable to decrease the energy per bit dissipated when transmitting I/O signals through the interposer 130.

The semiconductor chip 120 with integrated photonics components is bonded to the interposer 130 using an adhesive layer 112. The interposer 130 and semiconductor chip 120 can be assembled together on a wafer scale or chip scale level. In particular, for a wafer scale implementation, a wafer scale interposer and full semiconductor wafer are first bonded together, and then the assembly is diced into discrete components. In the wafer scale implementation, the size (footprint) of the interposer 130 and the semiconductor chip 120 would be the same. Furthermore, in the wafer scale implementation, the size of the semiconductor chip 120 can be larger than the maximum reticle size, and as large as the wafer (wafer scale integration). In this regard, in one embodiment of the invention, the semiconductor chip 120 shown in FIG. 1 may comprise a semiconductor wafer.

For a chip scale implementation, a semiconductor wafer is diced into individual chips (e.g., semiconductor chip 120, FIG. 1), and then the individual chips are assembled to separate interposers. For the chip scale implementation, an interposer can have a larger footprint size than the semiconductor chip, which provides an advantage of allowing the interposer to spread a larger number of I/Os to the application board, as compared to the wafer scale solution.

As further shown in FIG. 1, the photonics package 110 and the IC chip 160 are flip-chip mounted to the application board 150 using C4 connections 170, for example, or other suitable flip-chip bonding techniques. The application board 150 comprises high-speed transmission lines 154 formed on a surface of the application board 150 to enable high-speed communications between the photonics package 110 and the IC chip 160. In one embodiment of the invention, the IC chip 160 comprises a VLSI digital/analog chip 160 (e.g., a microprocessor, a transceiver, etc.), which can be fabricated using chip technologies such as bulk Si, SiGe, GaAs, InP, etc. While the IC chip 160 could be wire-bonded to the application board 150 instead of flip-chip mounted, this mounting technique is not as desirable as this results in a decrease from the maximum data transmission speed that could be achieved with flip-chip mounting.

In one embodiment of the invention, the thickness of the BEOL structure 123 is about 10 um to about 15 um. In addition, the thickness of the active silicon layer 122 is about 0.15 um. As noted above, the active silicon layer 122 is patterned to form the optical waveguide structure 126 to transmit light to and from the optoelectronic device 140, wherein the SOI film is used as a waveguide for the light. The thickness of the insulating layer 121 (e.g., BOX layer) is typically about 0.15 um which is about 10× smaller than the wavelength of light that is used by the photonic devices.

As further shown in FIG. 1, since the thickness of the insulating layer 121 may not be a thick enough cladding to prevent light from leaking out of the core of the optical waveguide 126, a thin capping layer 142 is formed on the insulating layer 121 to provide additional cladding. In one embodiment, the capping layer 142 has a thickness of about 2 um. In one embodiment, the capping layer 142 is formed of a dielectric material having a dielectric constant that is lower than the dielectric constant of the material forming the waveguide core. For example, the capping layer 142 can be formed of SiN or $SiO_2$, or some other low-dielectric constant material which is transparent for the operating wavelength of light.

The capping layer 142 is patterned to expose portions of the underlying insulating layer 121 in regions of the semiconductor chip 120 where photonic devices are connected to the semiconductor chip 120. For instance, as shown in FIG. 1, the capping layer 142 is patterned to expose a portion of the underlying insulating layer 121 where the optoelectronic device 140 is mounted in alignment with one end of the silicon waveguide 126. This enables light to be coupled between the optoelectronic device 140 and the end portion of the silicon waveguide 126 using adiabatic coupling or vertical grating coupling techniques, as discussed below.

Furthermore, as shown in FIG. 1, a polymer waveguide 180 (e.g., flex ribbon waveguide) is connected to the photonics package 110 by removing a portion of a cladding layer 184 to expose a length portion of an inner core layer 182, and then connecting the exposed portion of the core 182 to the insulating layer 121 (e.g., BOX layer). This configuration enables adiabatic coupling of light between the polymer waveguide 180 and the silicon waveguide 126. The light from a laser, a modulator, or a photodiode, etc., can also be coupled adiabatically or through a vertical grating coupler.

The illustrative package structure 100 shown in FIG. 1 allows a large amount of integrated photonics devices (coupler, filter, multiplexer . . . ) to be integrated with VLSI CMOS and external photonics (laser, photodiode . . . ) using 3D assembly (as described below). In this regard, packaging techniques according to embodiments of the invention as discussed herein provide flexible package architectures, because such packaging structures enable the heterogeneous packaging and integration of CMOS and photonics devices with external photonics devices. For example, the integration of a laser diode within a CMOS chip is extremely challenging since laser diodes are formed with compound semiconductors. As such, the heterogeneous package integration of an optoelectronics device 140 (having laser diodes) with a CMOS chip provides a more practical approach. It is to be understood that some photonics functions (e.g., a modulator) can be co-integrated/co-fabricated with CMOS circuitry in a VLSI SOI chip, or otherwise formed as part of a separate external optoelectronic chip that is packaged with a VLSI SOI chip using techniques as described herein. The package designer will choose the best approach based on performance, size, cost, thermal considerations.

Heat sinks are usually implemented for reliable operation of photonics devices. In the package structure shown in FIG. 1, a backside surface of the optoelectronics device 140 is exposed so that a cooling member, such as a heat sink or cooling plate can be thermally coupled to the backside surface of the active optoelectronics device 140 for cooling.

In an alternate embodiment of the invention, the interposer 130 may be a multi-layer structure having more than one interposer substrate, wherein the substrates are mounted to each other and connected using standard bonding techniques. Furthermore, while the illustrative embodiment of FIG. 1 shows a photonics package structure comprising one semiconductor chip, in an alternate embodiment of the invention, a photonics package structure can be fabricated by stacking two or more integrated circuit chips together along with one or more interposer substrates using 3D packaging techniques. For example, a second integrated circuit chip comprising one or more memory arrays or active circuitry performing additional functions can be included in a photonics package of FIG. 1 along with the semiconductor chip 120 in a 3D stacked configuration.

In this case, second semiconductor chip can be mounted face-to-face, for example, with the second semiconductor chip having TSVs (silicon through vias) formed in the backside of the chip to provide electrical connections to an interposer.

Figure 2A:
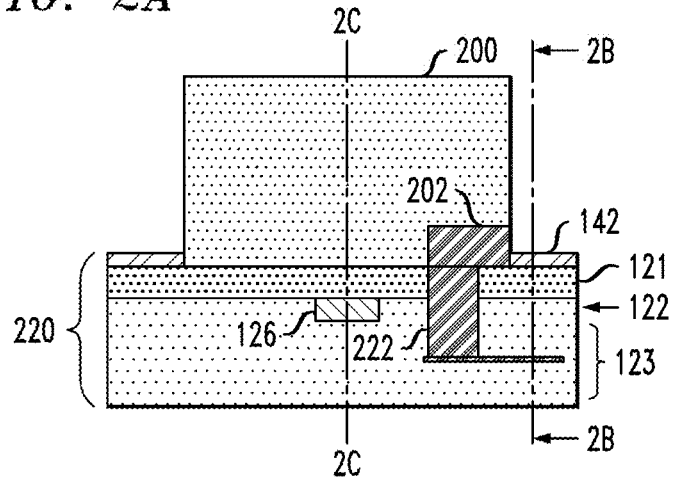
FIGS. 2A, 2B, and 2C are schematic views that illustrate a method for electrically and optically coupling an optoelectronics device to a SOI semiconductor chip, according to an embodiment of the invention.
Figure 2B:
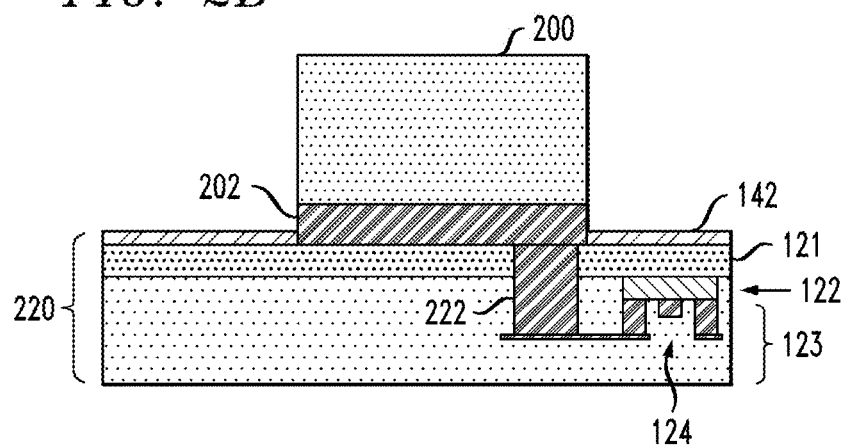
Figure 2C:
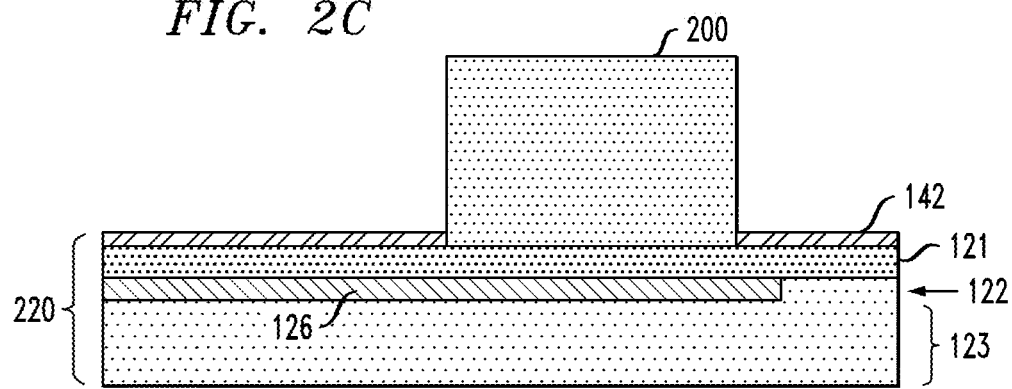

FIGS. 2A, 2B, and 2C are schematic views that illustrate a method for electrically and optically coupling an optoelectronics device to a SOI semiconductor chip, according to an embodiment of the invention. More specifically, FIG. 2A is a schematic cross-sectional view showing an optoelectronics device 200 mounted to a SOI semiconductor chip 220, FIG. 2B is a lateral cross-sectional view of the structure of FIG. 2A along line 2B-2B in FIG. 2A, and FIG. 2C is a lateral cross-sectional view of the structure of FIG. 2A along line 2C-2C in FIG. 2A.

As shown in FIGS. 2A-2C, the optoelectronics device 200 comprises at least one ohmic contact 202 formed on one side thereof. The semiconductor chip 220 is similar to the semiconductor chip 120 in FIG. 1. However, FIGS. 2A-2C further depict the use of at least one inverted pad 222 to electrically connect the external optoelectronics device 200 to the semiconductor chip 220. The inverted pad 222 comprises a conductive via that is formed through the BOX layer 121 using techniques discussed in further detail below. The optoelectronics device 200 (with the ohmic contact(s) 202) is separately fabricated and then flip-chip mounted to the semiconductor chip 220 by bonding the ohmic contact 202 to the inverted pad 222. While only one ohmic contact 202 and corresponding inverted pad 222 is shown in FIGS. 2A and 2B, the optoelectronics device 200 may have two or more ohmic contacts formed on an active surface thereof, which are connected to two or more corresponding inverted pads formed in the semiconductor chip 220.

The ohmic contact 202 and inverted pad 222 form an electrical contact between the external photonics device 200 and the active circuitry (e.g., FET 124) of the semiconductor chip 220. These electrical contacts enable power to be supplied to the optoelectronics device 200 from the semiconductor chip 220, as well as transmit electrical control signals or data between the optoelectronics device 200 and the semiconductor chip 200. Since the electrical connections between the active circuitry and the external photonic device 200 are short (about 0.25 um to about 10 um), very high efficiency and high bit rate data transfer can be achieved.

As further shown in FIG. 2C, the silicon waveguide 126 has a continuous length that extends below central portion of the optoelectronics device 200 to provide adiabatic coupling of light between the external photonic device 200 and an end portion of the silicon waveguide 126. In other words, an end portion of the silicon waveguide 126 which is aligned to the optoelectronics device 200 provides an adiabatic coupler that couples light travelling horizontally from the Si waveguide 126 to the external optoelectronics device 200. The external optoelectronics device 200 comprises an integrated photonic waveguide (not shown) that is disposed parallel to the photonic waveguide 126 and separated at a distance that is defined by the thickness of the insulating BOX layer 121. Since a BOX layer implemented in VLSI SOI technology is much thinner (~0.15 um) than the light wavelength (~1.5 um), the light leaks from one waveguide to the other, thus coupling the light between the integrated and external photonic devices. The adiabatic coupling allows horizontal coupling of external photonic devices such as, for example, DFB (distributed feedback) laser diodes, as well as integrated photonic devices such as multiplexers, modulators or filters which are formed as part of the active circuit of the semiconductor chip.

Figure 3A:
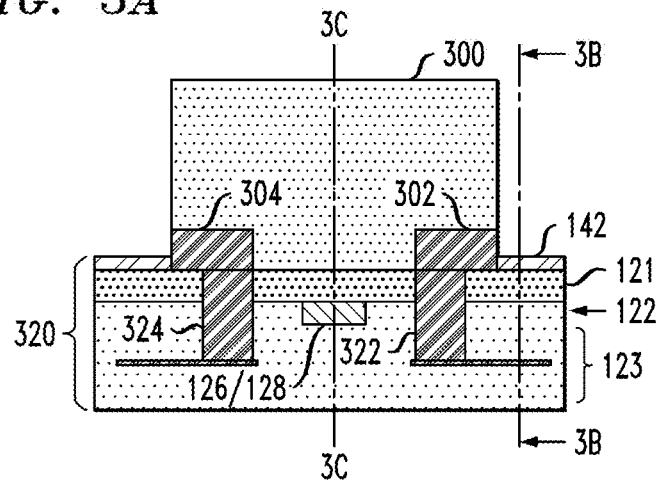
FIGS. 3A, 3B, and 3C are schematic views that illustrate a method for electrically and optically coupling an optoelectronics device to a SOI semiconductor chip, according to another embodiment of the invention.
Figure 3B:
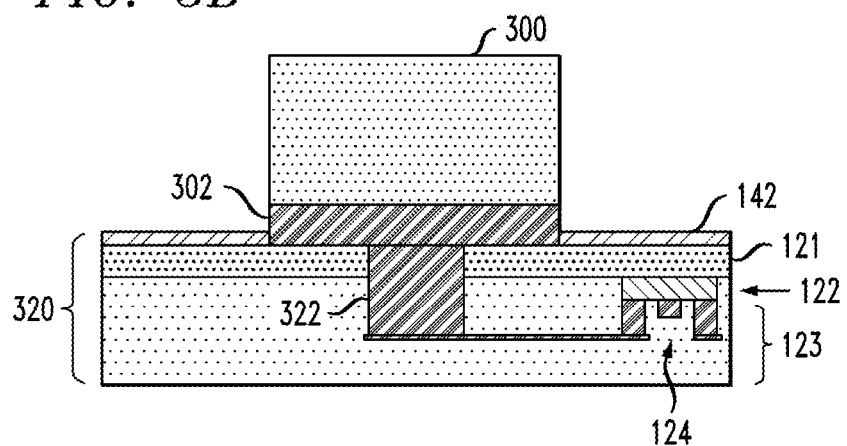
Figure 3C:
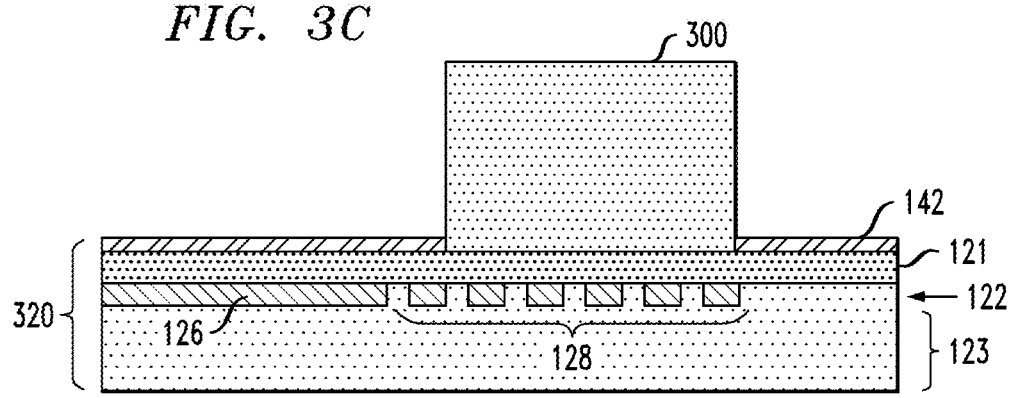

FIGS. 3A, 3B, and 3C are schematic views that illustrate a method for electrically and optically coupling an optoelectronics device to a SOI semiconductor chip, according to another embodiment of the invention. More specifically, FIG. 3A is a schematic cross-sectional view showing an optoelectronics device 300 mounted to a SOI semiconductor chip 320, FIG. 3B is a lateral cross-sectional view of the structure of FIG. 3A from the view point of line 3B-3B in FIG. 3A, and FIG. 3C is a lateral cross-sectional view of the structure of FIG. 3A along line 3C-3C in FIG. 3A.

As shown in FIGS. 3A-3C, the optoelectronics device 300 comprises a plurality of ohmic contacts 302 and 304 formed on one side thereof, and the semiconductor chip 320 comprises a plurality of corresponding inverted pads 322 and 324, which are electrically connected to the corresponding ohmic contacts 302 and 304, to electrically connect the external optoelectronics device 300 to the semiconductor chip 320. The optoelectronics device 300 (with the ohmic contacts 302 and 304) is separately fabricated and then flip-chip mounted to the semiconductor chip 320 by bonding the ohmic contacts 302 and 304 to the respective inverted pads 322 and 324, to form electrical contacts between the external optoelectronics device 300 and the active circuitry (e.g., FET 124) of the semiconductor chip 320. While only two ohmic contact 302 and 304 and corresponding inverted pads 322 and 324 are shown in FIGS. 3A and 3B, the optoelectronics device 300 may have three or more ohmic contacts formed on an active surface thereof, which are connected to three or more corresponding inverted pads formed in the semiconductor chip 320.

As noted above, these electrical contacts enable power to be supplied to the optoelectronics device 300 from the semiconductor chip 320, as well as electrical signals to be transmitted between the optoelectronics device 300 and the semiconductor chip 320. Since the connections between the circuit and the external photonic device are short (about 0.25 um to about 10 um), very high efficiency and high bit rate data transfer can be achieved.

As further shown in FIG. 3C, and end portion of the silicon waveguide 126 comprises a vertical grating coupler 128 which extends below a central portion of the optoelectronics device 300 to provide gated coupling of light between the external photonic device 300 and end portion of the silicon waveguide 126. The vertical grating coupler 128 comprises a vertical grating coupler such as a fully etched second-order waveguide grating that out-couples optical radiation from the silicon waveguide 126 at a well-defined angle with respect to the surface normal of the semiconductor chip 320. The vertical grating coupler 128 is configured to change the light propagation direction from horizontal in the Si photonic waveguide 126 to vertical at the grating coupler output 128. This optical coupling enables the use of external vertical photonics devices such as vertical-cavity surface-emitting laser (VCSEL) laser elements or photodiodes, wherein a VCSEL semiconductor laser diode emits an optical laser beam perpendicular from a surface of the optoelectronics device 300.

Figure 4A:
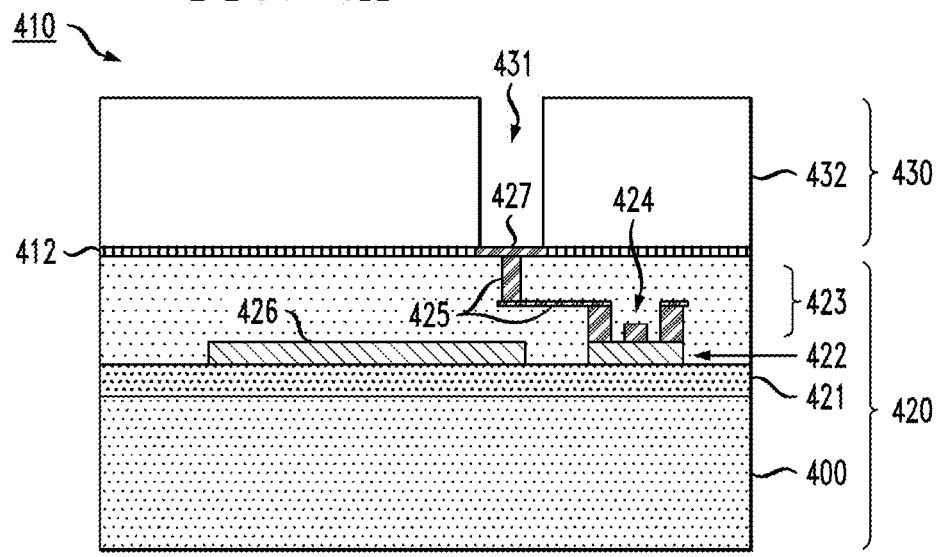

FIGS. 4A, 4B, 4C, 4D, 4E, 4F, 4G, 4H, 4I, and 4J schematically illustrate a method for fabricating a photonics package structure, according to an embodiment of the invention. In particular, FIGS. 4A-4J illustrate a method for assembling a SOI semiconductor chip and interposer to form a photonics package, such as the photonics package 110 of FIG. 1, according to an embodiment of the invention. FIG. 4A is a cross-sectional view of a photonics package structure 410 at an intermediate stage of fabrication where a SOI semiconductor substrate 420 and interposer 430 are bonded together using an adhesive layer 412.

The SOI semiconductor substrate 420 comprises a bulk substrate layer 400, a BOX layer 421, an active silicon layer 422, and a BEOL structure 423. The SOI semiconductor substrate 420 can be fabricated using standard CMOS and VLSI front-end-of-line processing steps to form active circuitry 424 and one or more silicon waveguides 426. The BEOL structure 423 comprises multiple levels of insulating material, via contacts and wiring 425 to interconnect the active circuitry, and to provide interconnects to a plurality of contact pads 427 that are formed as part of the final metallization level of the BEOL structure 423. The contact pads 427 provide bonding sites for chip-to-interposer connections.

As further shown in FIG. 4A, the interposer 430 comprises a substrate 432 having via holes 431 formed through the substrate 432. The via holes 431 are aligned to corresponding contact pads 427 of the BEOL structure 423 of the SOI semiconductor chip 420. As noted above, the substrate 432 may be formed of glass or high-resistivity silicon, for example. In one embodiment, when the interposer 430 is fabricated using a glass substrate 432, the via holes 431 (through glass vias) are formed in the substrate 432 prior to bonding the substrate 432 to the semiconductor chip 420 using the adhesive layer 412. In another embodiment, when the interposer 430 is fabricated using a high-resistivity Si substrate 432, the substrate 432 can be bonded to the semiconductor chip 420 using the adhesive layer 412 prior to forming the via holes 431 (through silicon vias). Once the substrate 432 is bonded to the semiconductor chip 420, the via holes 431 can be etched using a standard photolithographic process using a patterned photoresist layer.

The substrate 432 (either glass substrate or HR-Si substrate) can be aligned to the semiconductor chip 420 using TGVs or TSVs that can be centered using dedicated last metal features that are designed into the semiconductor chip 420 which are not intended for electrical connections. For example, cross-shaped features can be patterned in the last metal level of the BEOL structure 423 of the semiconductor chip 420, wherein the cross-shaped features are centered within the corresponding TGVs or TSVs across the die or wafer. As noted above, it is to be understood that such process can be performed for a single chip or the full wafer (wafer scale packaging). For example, with a single diced chip process, the interposer substrate 432 (glass or high-resistivity substrate) can be larger than the semiconductor chip 420, thus allowing to spread a large amount of wires between the semiconductor chip 420 and an application board (e.g., board 150, FIG. 1) through the interposer 430. For wafer scale level packaging, once the full packaging is done and the chips are diced, the interposer 430 will have the exact same dimension as the SOI semiconductor chip 420.

Figure 4B:
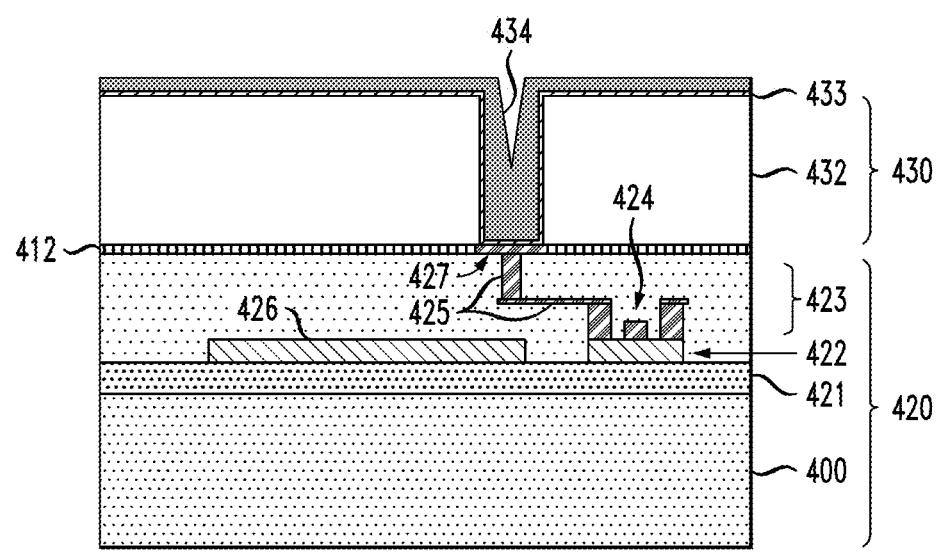

A next step in the fabrication process includes metalizing the via holes 431 to form conductive through vias in the interposer substrate 432. For example, FIG. 4B is a cross-sectional schematic view of the package structure of FIG. 4A after filing the via holes 431 with metallic material to form conductive through vias, according to an embodiment of the invention. The conductive through vias can be fabricated using known techniques. For example, a thin barrier layer (e.g., Ta or TiN) can be deposited to line the exposed surfaces of the substrate 432 in the via holes 431, followed by the deposition of a thin seed layer 433 (e.g., copper seed layer). The barrier layer and seed layer 433 can be deposited using known techniques, such as chemical vapor deposition (CVD) or physical vapor deposition (PVD), etc. The seed layer 433 is then used as a base layer to grow a layer of metallic material (e.g., copper) on the seed layer 433 using standard electroplating techniques (e.g., for CMOS backend processes), and fill the via holes 431 with metallic material to form conductive vias 434 in the substrate 432.

Figure 4C:
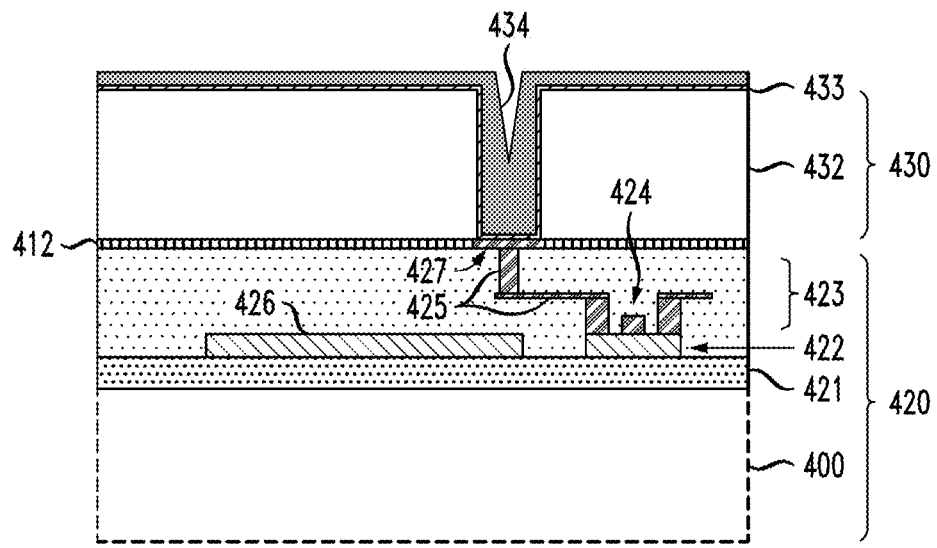

After forming the conductive vias 434 in the interposer substrate 432, a backside grind/etch process is performed to remove the bulk substrate layer 400 of the semiconductor chip 420. For example, FIG. 4C is a cross-sectional schematic view of the package structure of FIG. 4B after removing the bulk substrate layer 400. In one embodiment, the bulk substrate layer 400 of the SOI semiconductor chip 420 is removed using a two-step grind and etch back process. In particular, a first step includes a mechanical grinding process to remove a majority of the bulk substrate 400, followed by a selective chemical etch process to remove a remaining portion of the bulk substrate 400 selective to the BOX layer 421. This process ensures that the BOX layer 421 is not over etched, which could occur if grinding is used alone.

Figure 4D:
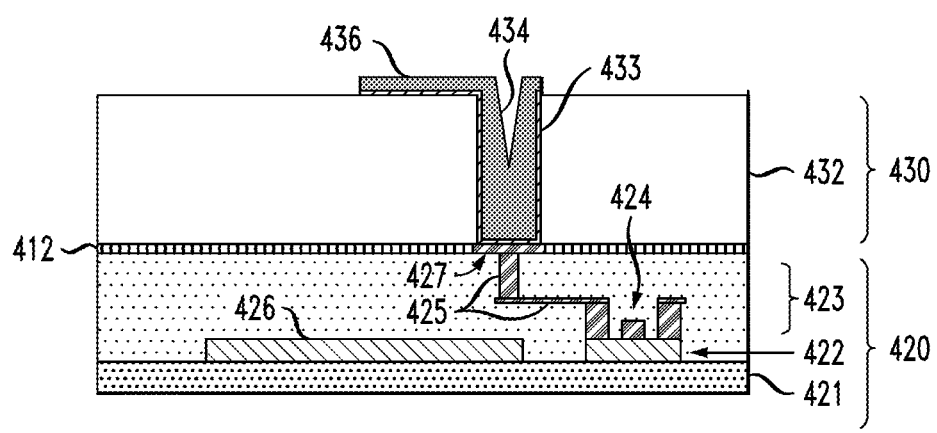

After removal of the bulk substrate 400, a next process includes pattering the metal layer on the surface of the interposer substrate 432 to form contact pads. For example, FIG. 4D is a cross-sectional schematic view of the package structure of FIG. 4C after patterning a layer of metallic material on the exposed surface of the interposer substrate 432 to form contact pads 436 that are electrically connected to the conductive vias 434 of the interposer 430, according to an embodiment of the invention. In one embodiment of the invention, the layer of copper metallization on the surface of the interposer 430 is patterned by depositing and patterning a photoresist layer to form a photoresist mask, and then performing a metal etch process to etch the metallic material (e.g., copper) exposed through openings of the photoresist mask and thereby form a pattern of contact pads/traces on the surface of the interposer substrate 432.

After forming the contact pads/traces 436 on the surface of the interposer substrate 432, the fabrication process continues with forming inverted pad structures which are used to electrically couple optoelectronic devices to the SOI semiconductor substrate 420. A process for fabricating inverted pad structures will be discussed with reference to FIGS. 4E, 4F, 4G, 4H, and 4I. For example, FIG. 4E is a cross-sectional schematic view of the package structure of FIG. 4D after forming a photoresist mask 440 and etching a recess 442 in the semiconductor chip 420 down to a buried pad 428 in the BEOL structure 423 using the photoresist mask 440, according to an embodiment of the invention.

Figure 4E:
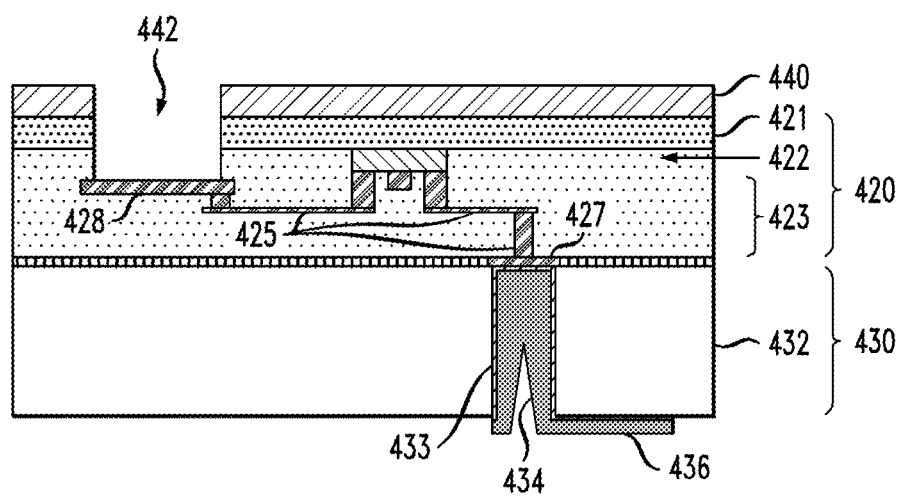

More specifically, in one embodiment of the invention, a layer of photoresist material is deposited on the BOX layer 421, and then developed and patterned to form the photoresist mask 440 as shown in FIG. 4E. One or more etch processes are then performed using the patterned photoresist layer 440 as an etch mask to etch the portions of the BOX layer 421 and insulating layers of the BEOL structure 423 to form the recess 442 down to the buried pad 428 which is formed at some intermediate metallization level in the BEOL structure 423.

Figure 4F:
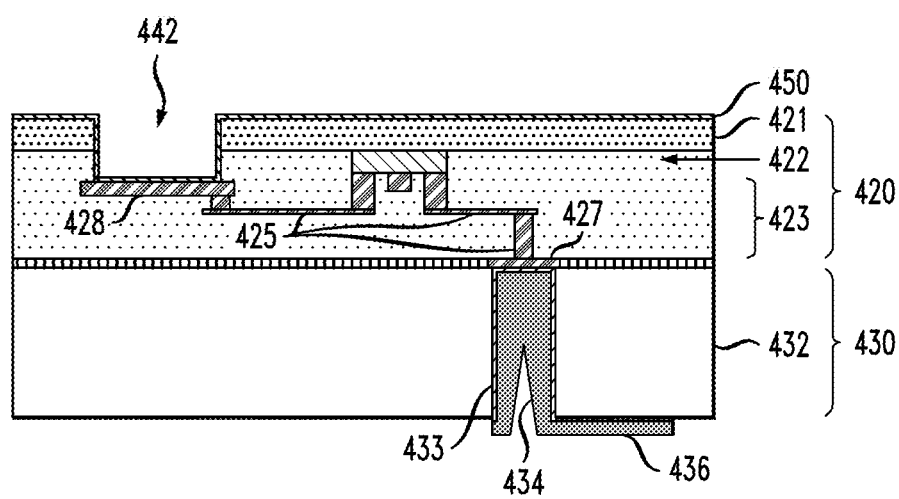

Next, FIG. 4F is a cross-sectional schematic view of the package structure of FIG. 4E after removing the photoresist mask 440 and depositing a seed layer 450 which lines the exposed surfaces within the recess 442, according to an embodiment of the invention. The seed layer 450 comprises a thin conformal seed layer which is formed using a suitable metallic material such as Ti, Cu, Ta, TaN, TiN, etc., and deposited using known techniques such as CVD or PVD, etc.

Figure 4G:
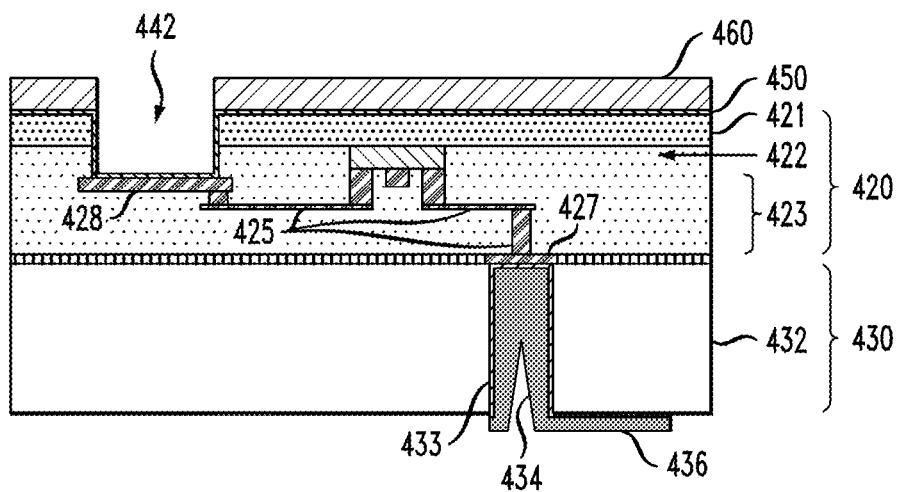
Figure 4H:
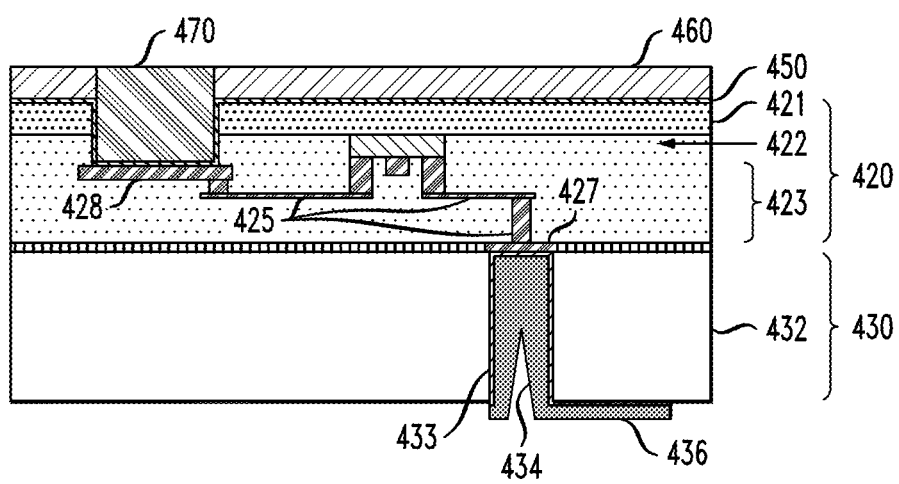
Figure 4I:
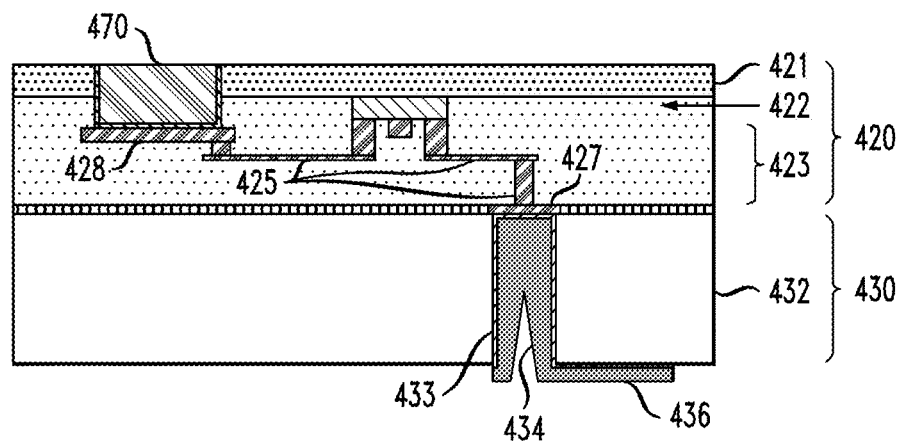

Following deposition of the seed layer 450, the recess is filled with a metallic material to form an inverted pad structure. For instance, FIG. 4G is a cross-sectional schematic view of the package structure of FIG. 4F after depositing and patterning a layer of photoresist material to form a photoresist mask 460 which is used to cover the portion of the seed layer 450 on the BOX layer 421 and to expose the recess 442. Next, FIG. 4H is a cross-sectional schematic view of the package structure of FIG. 4G after filling the recess 442 with metallic material 470 (e.g., copper). Finally, FIG. 4I is a cross-sectional schematic view of the package structure of FIG. 4H after removing the photoresist mask 460 and etching back the metallic material 470 down to the BOX layer 421. A CMP (chemical mechanical polishing) process can be performed to planarize the surface of the semiconductor substrate 420, e.g., etch down the metallic material 470 to be even with the BOX layer 421. The remaining metallic material 470 forms an inverted pad (e.g., conductive vias 222, 322, and 324 shown in FIGS. 2A, 2B, 3A and 3B).

Figure 4J:
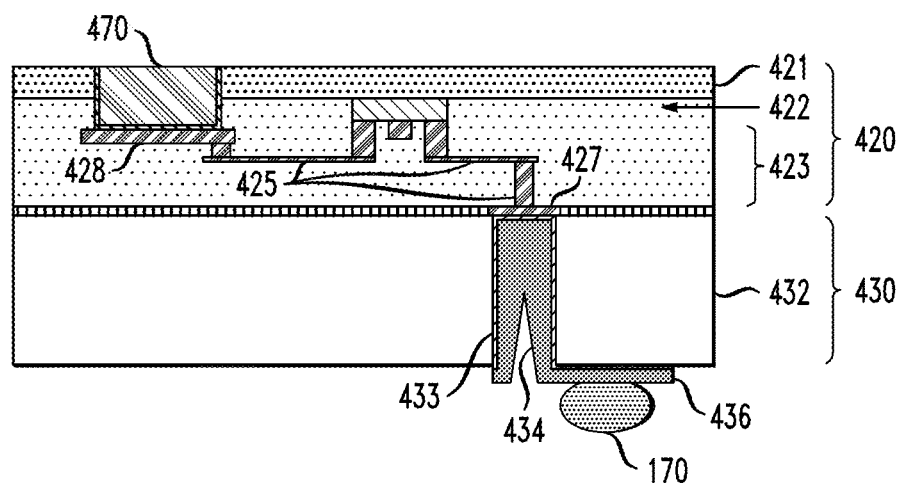

Following the formation of the inverted pad structures 470, the contact pads 436 of the interposer substrate 432 are then bumped with C4 solder balls, or micro-C4, Cu pillars, etc., using a process that is commonly implemented in state of the art microelectronic packaging. For example, FIG. 4J is a cross-sectional schematic view of the package structure of FIG. 4I after forming C4 solder balls 170 on the contact pads 436 of the interposer 430, according to an embodiment of the invention. It is understood that part of the bumping process may include the deposition and patterning of an intermediate dielectric layer to form a mask for a plating process used to form the solder bumps 170.

Following formation of the solder bumps 170, layer of capping material is deposited on the BOX layer 421 to provide an additional cladding layer that prevents light from leaking out from silicon waveguides (e.g., silicon waveguide 426, FIG. 4A) that are formed from the active silicon layer 422. The layer of capping material is patterned to form a capping layer (e.g., capping layer 142, FIG. 1) to expose portions of the BOX layer 421 and the inverted pad structures 470 to which external optoelectronic or photonic devices are bonded. Indeed, as discussed above, exposing the inverted pad structures 470 allows optoelectronic devices with corresponding ohmic contacts to be bonded to the inverted pad structures 470.

Figure 5:
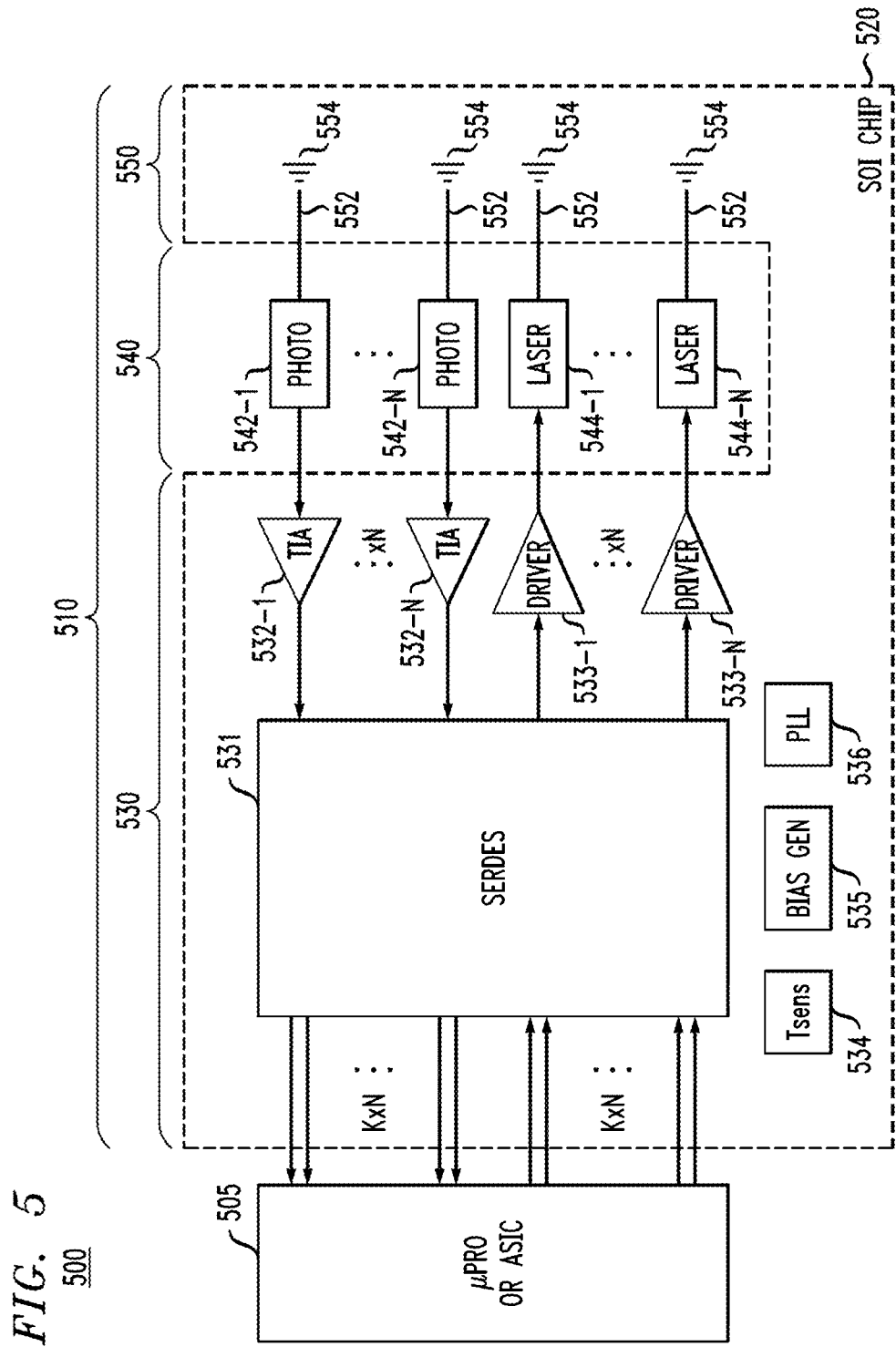
FIG. 5 schematically illustrates a high-level conceptual package framework to implement an optical transceiver system, according to an embodiment of the invention.

FIG. 5 schematically illustrates a high-level conceptual package framework to implement an optical transceiver system, according to an embodiment of the invention. In particular, FIG. 5 schematically illustrates a package structure 500 comprising a high-performance microprocessor 505 coupled to a photonics communications system 510. The photonics communications system 510 comprises a SOI semiconductor chip 520 comprising active analog/digital circuitry 530 to support optical receiver and transmitter functions. More specifically, the active circuitry 530 comprises a SERDES (serializer/deserializer) circuit 531, a plurality (N) of transimpedance amplifier circuits 532-1, . . . , 532-N, a plurality (N) of laser driver circuits 533-1, . . . , 533-N, a temperature sensor circuit 534, a bias voltage generator circuit 535, and a phase-locked loop circuit 536.

Furthermore, a plurality of optoelectronic devices 540 are mounted to the SOI chip 520, which include photodiodes 542-1, . . . , 542-N to support optical receiver functions, and laser diodes 544-1, . . . , 544-N to support optical transmitter functions. Each of the optoelectronic devices 540 are coupled to a silicon waveguide structure 550 comprising a silicon waveguide 552 and a vertical grating coupler 554. The outputs of the photodiodes 542-1, . . . , 542-N are coupled to the inputs of respective transimpedance amplifier circuits 532-1, . . . , 532-N. The outputs of the laser driver circuits 533-1, . . . , 533-N are coupled to the inputs of respective laser diodes 544-1, . . . , 544-N.

The temperature sensor circuit 534 monitors the temperature of certain areas of the SOI chip 520 and generates sensor signals that are used by various circuits that are configured to have temperature-compensated programmability, for example. The bias generator circuit 535 generates the requisite reference voltage(s) and/or reference current(s)

that are used by the SERDES circuit 531, the transimpedance amplifier circuits 532-1, ..., 532-N, and the laser driver circuits 533-1, ..., 533-N. The phase-locked loop circuit 536 generates a clock signal that is used to sample the receive data and a clock signal that is used to clock the serial transmission of data.

To implement receive functions, optical data signals that are incident on the vertical grating couplers 554 in one or more of the N receive paths are captured by the vertical grating couplers 554 and transmitted to the inputs of the photodiodes 542-1, ..., 542-N via the associated silicon waveguides 552. The photodiodes 542-1, ..., 542-N convert the received optical data signals into electrical data signals in the form of a current. The transimpedance amplifier circuits 532-1, ..., 532-N comprise current-to-voltage amplifiers which transform the current data signals output from the respective photodiodes 542-1, ..., 542-N into voltage data signals that are processed by the SERDES circuit 531.

To implement transmit functions, serial data streams that are output from the SERDES circuit 531 to the N transmit paths are input to respective laser driver circuits 533-1, ..., 533-N. The laser driver circuits 533-1, ..., 533-N are configured to control modulation of the respective laser diodes 544-1, ..., 544-N and cause the respective laser diodes 544-1, ..., 544-N to generate and output optical laser signals that represent the data signals to be transmitted. The optical signals that are output from the laser diodes 544-1, ..., 544-N are transmitted via the associated silicon waveguides 552 to associated vertical grating couplers 554, where the optical signals are de-coupled and transmitted as light beams to a receiving optical circuit.

The photonics communications system 510 of FIG. 5 allows a transmit mode in which data that is output from the microprocessor 505 on K×N parallel channels is serialized into N parallel channels (K reduction) with increase in the speed (bits/second) by a factor of K. Similarly, the photonics system 510 allows a receive mode in which serial data streams from N parallel channels are parallelized into K×N parallel channels (K multiplication) for input to the microprocessor 505 with a reduction in speed (bits/second) by a factor of K. FIG. 5 shows an application example where complex analog/digital can be integrated in a package with some photonics functions allowing the integration of all the calibration loops, which is required for high-yield reliable products.

Figure 6:
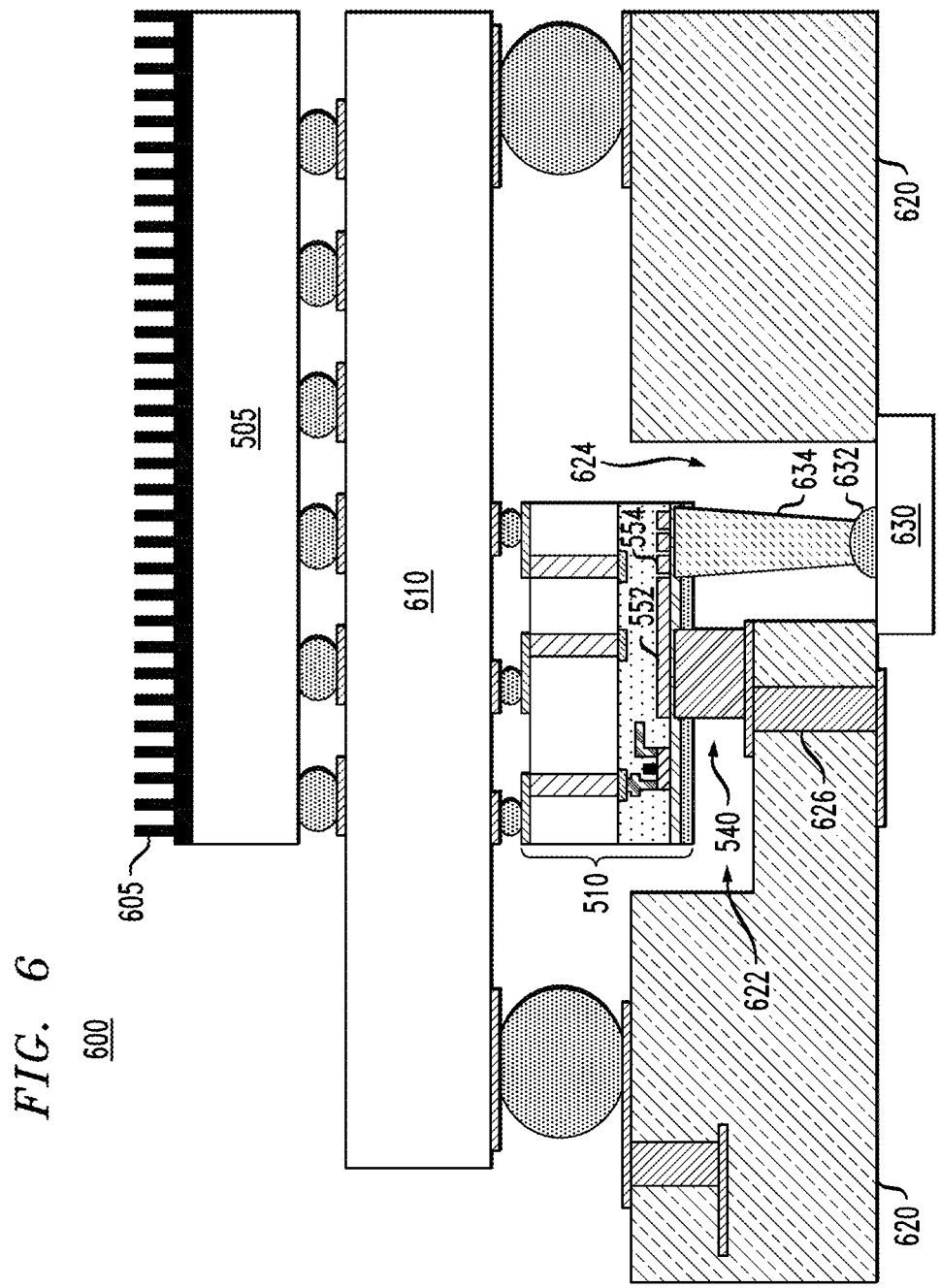
FIG. 6 is a schematic cross-sectional side view of a package structure to implement an optical transceiver system based on the conceptual framework of FIG. 5, according to an embodiment of the invention.

FIG. 6 is a schematic cross-sectional side view of a package structure to implement an optical transceiver system based on the conceptual framework of FIG. 5, according to an embodiment of the invention. In particular, FIG. 6 illustrates a package structure 600 for packaging the high-performance microprocessor 505 and the photonics communications system 510. In this embodiment, the high-performance microprocessor 505 comprises a high-power density (>50 W/cm2) VLSI ASIC or server microprocessor. The high-performance microprocessor 505 is flip-chip mounted to one side of a package interposer 610 and the photonics communications system 510 comprising the optoelectronic devices 540 is flip-chipped to an opposite side of the package interposer 610, which serves to thermally isolate the photonics communications system 510 from the high-power density of the VLSI microprocessor 505. The high-performance microprocessor 505 is cooled using a heat sink 605 mounted to the backside of the high-performance microprocessor 505.

The package interposer 610 is mounted to an application board 620, wherein a recess 622 in the application board 620 is formed to depth that allows the backside surfaces of the externally mounted optoelectronics devices 540 (e.g., laser diodes, photodiodes) to make contact to thermal vias 626 that are formed in the application board 620 and provide cooling of the optoelectronics devices 540 to ensure high-reliability operation. In addition, a hole 624 is formed through the application board 620, and an optical fiber device 630 with a focusing lens 632 is aligned to the hole 624 to allow light beams 634 to transmit between corresponding optical fibers 630 and the vertical grating couplers 554.

Figure 7:
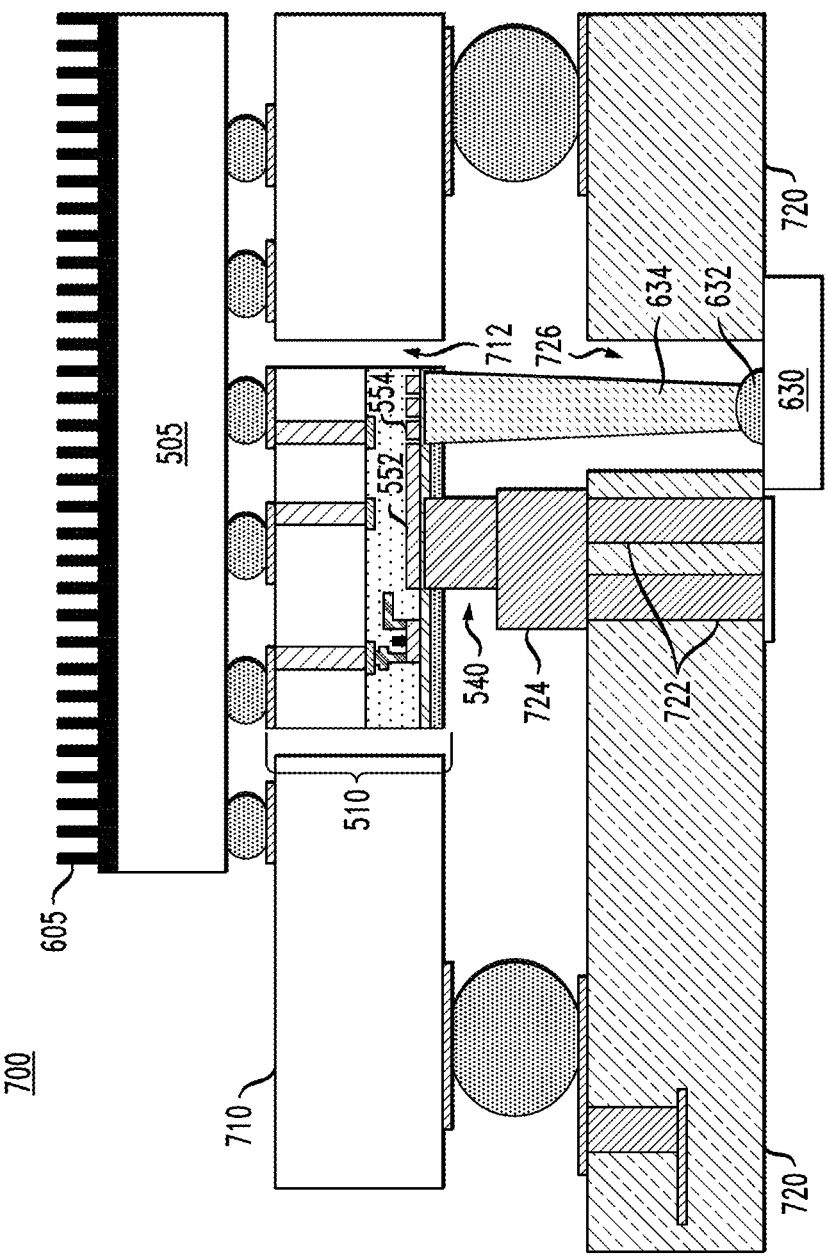
FIG. 7 is a schematic cross-sectional side view of a package structure to implement an optical transceiver system based on the conceptual framework of FIG. 5, according to another embodiment of the invention.

FIG. 7 is a schematic cross-sectional side view of a package structure to implement an optical transceiver system based on the conceptual framework of FIG. 5, according to another embodiment of the invention. In particular, FIG. 7 illustrates a package structure 700 for packaging the high-performance microprocessor 505 and the photonics communications system 510, wherein the high-performance microprocessor 505 comprises medium-power density (<50 W/cm2) VLSI circuitry. In this embodiment, the photonics communications system 510 comprising the optoelectronic devices 540 is flip-chip mounted directly to the active surface of the high-performance microprocessor 505, since the photonics communications system 510 does not need to be thermally isolated from the medium power density microprocessor 505. As further shown in FIG. 7, the microprocessor 505 is flip-chip mounted to a package interposer 710, wherein the package interposer 710 comprises a hole 712 that is cut through the package interposer 710 to accommodate the photonics communication system 510.

The package interposer 710 is mounted to an application board 720. The application board 720 includes a plurality of thermal vias 722 and a heat sink 724. The heat sink 724 is formed with a thickness such that the heat sink 724 contacts a backside of the optoelectronic devices 540 (e.g., laser diodes, photodiodes) to cool the devices 540 and ensure high-reliability operation. In addition, a hole 726 is formed through the application board 720, wherein the optical fiber device 630 with the focusing lens 632 is aligned to the hole 726 to allow light beams 634 to transmit between corresponding optical fibers 630 and the vertical grating couplers 554. The package 700 of FIG. 7 enables shorter electrical connections between the VLSI chip 505 and the electrical circuitry and optoelectronic devices 540 of the photonics communication system 510.

Although embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We claim:
1. A method to construct a package structure, comprising:
   fabricating a first integrated circuit chip comprising a silicon-on-insulator (SOI) substrate, wherein the SOI substrate comprises a bulk substrate layer, a buried oxide layer disposed on the bulk substrate layer, an active silicon layer disposed on the buried oxide layer, and a BEOL (back-end-of-line) structure formed over the active silicon layer, wherein the active silicon layer comprises active circuity and an integrated optical waveguide structure;
   bonding a first surface of an interposer substrate to the BEOL structure of the first integrated circuit chip;

forming conductive through vias in the interposer substrate in alignment with contact pads of the BEOL structure, and forming contact pads on a second surface of the interposer substrate;

removing the bulk substrate layer;

depositing a capping layer on the buried oxide layer and patterning the capping layer to expose the buried oxide layer;

forming one or more inverted pad structures through the exposed buried oxide layer down to buried pads within the BEOL structure;

forming solder bumps on the contact pads of the interposer substrate; and mounting an optoelectronics device to the first integrated circuit chip by bonding the optoelectronics device to ends of the inverted pad structures exposed through the buried oxide layer, and such that the optoelectronics device is aligned with a first end of the integrated optical waveguide structure of the first integrated circuit chip.

2. The method of claim 1, further comprising bonding a waveguide core of a flexible polymer waveguide to portion of the buried oxide layer in alignment with a second end of the integrated optical waveguide structure, wherein the waveguide core is adiabatically coupled to the second end of the integrated optical waveguide structure through the buried oxide layer.

3. The method of claim 1, wherein the optoelectronics device is adiabatically coupled to the first end of the integrated optical waveguide structure through the buried oxide layer.

4. The method of claim 1, wherein first end of the integrated optical waveguide structure comprises a vertical grating coupler to couple light between the optical waveguide structure and the optoelectronics device.

5. The method of claim 1, wherein the optoelectronics device comprises at least one of a laser diode, a photodiode, a photonics device, and a combination thereof.

6. The method of claim 1, wherein the interposer substrate is formed of a material comprising one of glass, high-resistivity silicon, and an insulator material.

7. The method of claim 1, wherein the active circuitry comprises at least one of optical receiver circuitry and optical transmitter circuitry, and wherein the BEOL structure provides electrical connections from the active circuitry to the optoelectronics device.

8. The method of claim 1, further comprising coupling a second integrated circuit chip to the first integrated circuit chip, wherein the second integrated circuit chip comprises a processor electrically coupled to the active circuitry of the first integrated circuit chip.

9. The method of claim 8, wherein coupling the second integrated circuit chip to the first integrated circuit chip comprises:

flip-chip mounting the second integrated circuit chip to contact pads on a first side of an application board; and bonding the solder bumps on the contact pads of the interposer substrate to contact pads on the first side of the application board;

wherein the application board comprises a plurality of high-speed transmission lines formed on the first side of the application board to enable electrical communication between the process of the second integrated circuit chip and the active circuitry of the first integrated circuit chip bonded to the interposer substrate.

10. The method of claim 8, wherein coupling the second integrated circuit chip to the first integrated circuit chip comprises using the solder bumps on the contact pads of the interposer substrate to bond the interposer substrate to an active surface of the second integrated circuit chip.

11. A method to construct a package structure, comprising:

fabricating a photonics package comprising:

a first integrated circuit chip comprising an insulating layer, an active silicon layer disposed adjacent to the insulating layer, and a BEOL (back-end-of-line) structure formed over the active silicon layer, wherein the active silicon layer comprises active circuitry and an integrated optical waveguide structure patterned from the active silicon layer;

an optoelectronics device mounted on the insulating layer of the first integrated circuit chip in alignment with a portion of the integrated optical waveguide structure, and electrically connected to the active circuitry; and an interposer bonded to the BEOL structure of the first integrated circuit chip, the interposer comprising at least one substrate having a plurality of conductive through vias and wiring to provide electrical connections to the BEOL structure; and coupling the photonics package to a second integrated circuit chip, wherein coupling the photonics package to the second integrated circuit chip comprises:

mounting the interposer of the photonics package to a first side of a package interposer; and mounting the second integrated circuit chip to a second side of the package interposer, opposite the first side of the package interposer;

wherein the package interposer comprises electrical wiring and through vias to provide electrical connections between the photonics package and the second integrated circuit chip; and mounting a portion of the first side of the package interposer to an application board;

wherein the second integrated circuit chip comprises a processor coupled to the active circuitry of the first integrated circuit chip.

12. The method of claim 11, wherein the optoelectronics device is adiabatically coupled to the integrated optical waveguide structure through the buried oxide layer.

13. The method of claim 11, wherein the integrated optical waveguide structure comprises a vertical grating coupler to couple light between the optical waveguide structure and the optoelectronics device.

14. The method of claim 11, wherein the optoelectronics device comprises at least one of a laser diode, a photodiode, a photonics device, and a combination thereof.

15. The method of claim 11, wherein the active circuitry comprises at least one of optical receiver circuitry and optical transmitter circuity, wherein the BEOL structure provides electrical connections from the active circuity to the optoelectronics device.

16. A method to construct a package structure, comprising:

fabricating a photonics package comprising:

a first integrated circuit chip comprising an insulating layer, an active silicon layer disposed adjacent to the insulating layer, and a BEOL (back-end-of-line) structure formed over the active silicon layer, wherein the active silicon layer comprises active circuitry and an integrated optical waveguide structure patterned from the active silicon layer;

an optoelectronics device mounted on the insulating layer of the first integrated circuit chip in alignment with a portion of the integrated optical waveguide structure, and electrically connected to the active circuity; and an interposer bonded to the BEOL structure of the first integrated circuit chip, the interposer comprising at least one substrate having a plurality of conductive through vias and wiring to provide electrical connections to the BEOL structure; and coupling the photonics package to a second integrated circuit chip; wherein coupling the photonics package to the second integrated circuit chip comprises bonding the interposer of the photonics package to an active surface of the second integrated circuit chip; and mounting a portion of the active surface of the second integrated circuit chip to a first side of a package interposer with the photonics package disposed within an opening formed through the package interposer from the first side to a second side of the package interposer; and mounting the second side of the package interposer to an application board.

\* \* \* \* \*